US006972552B2

(12) United States Patent
Ursic

(10) Patent No.: US 6,972,552 B2
(45) Date of Patent: Dec. 6, 2005

(54) METHOD FOR THE PRECISE MEASUREMENT OF DEPENDENCY ON AMPLITUDE AND PHASE OF A PLURALITY OF HIGH FREQUENCY SIGNALS AND A DEVICE FOR CARRYING OUT SAID METHOD

(75) Inventor: Rok Ursic, Nova Gorica (SI)

(73) Assignee: Instrumentation Technologies D.O.O., Solkan (SI)

( * ) Notice: Subject to any disclaimer, the term of this patent is extended or adjusted under 35 U.S.C. 154(b) by 0 days.

(21) Appl. No.: 10/839,592

(22) Filed: May 5, 2004

(65) Prior Publication Data
US 2004/0222778 A1    Nov. 11, 2004

(30) Foreign Application Priority Data
May 5, 2003    (SI)    ............................. P-200300115

(51) Int. Cl.[7] ........................................... G01N 27/00
(52) U.S. Cl. ..................................... 324/71.3; 324/605
(58) Field of Search ....................... 315/503; 324/71.3, 324/409, 605

(56) References Cited

U.S. PATENT DOCUMENTS 5,057,766 A * 10/1991 Nakata et al. ............. 324/71.3

* cited by examiner

Primary Examiner—Walter Benson
(74) Attorney, Agent, or Firm—Roger J. French

(57) ABSTRACT

A method and device for measurement of dependency on amplitude and phase of a plurality of high frequency signals used primarily with a synchrotron accelerator of elementary particles, includes alternately directing, with a radio frequency (RF) switch, each analogue input signal to each of a plurality of RF processing units; amplifying each analogue input signal in each RF processing unit in order to adjust signals to the measuring range of a plurality of analogue digital converters; directing each amplified analogue input signal to each of a plurality of analogue digital converters; converting the analogue signals to digital signals; directing the digital signals to a plurality of amplification correctors; correcting the digital signals by means of correcting signals from an amplification equalizer; collecting corrected digital signals in a digital switch and directing the ordered recombined number of digital signals to each of a plurality of digital receivers; and filtering the recombined number of digital signals in a plurality of low-pass filters.

10 Claims, 2 Drawing Sheets

METHOD FOR THE PRECISE MEASUREMENT OF DEPENDENCY ON AMPLITUDE AND PHASE OF A PLURALITY OF HIGH FREQUENCY SIGNALS AND A DEVICE FOR CARRYING OUT SAID METHOD

This application claims priority to the Slovenian Application No. P-200300115, filed on May 5, 2003 in the Slovenian Intellectual Property Office.

BACKGROUND AND SUMMARY OF THE INVENTION

The present invention refers to a method for the precise measurement of dependency on amplitude and phase of a plurality of high frequency signals, preferably in the synchrotron accelerator of elementary particles, and to a device for carrying out said method.

Modern synchrotron accelerators of elementary particles, and in particular the sources of the synchrotron light, set up very strict demands as to the accuracy, repeatability and resolution when measuring the position of the accelerated elementary particles in the direction transversal to the direction of motion thereof. Said measurements must particularly meet requirements of sub micron resolution, of high accuracy which is independent of the current intensity of the accelerated particles, of repeatability of measurements during a longer period of time, of the uninterrupted transmission of measurements in real time during the regular operation of the accelerator, and of transmitting of a plurality of series broadband measurements with a sampling frequency that generally exceeds a million samples per second. Said measurements are of vital importance at the startup of the accelerator, and an indispensable diagnostic when optimizing and studying the operation of the accelerator.

Multichannel measuring devices mostly do their job with success; however, they share a common disadvantage reflecting in intermittence and time variability of transfer functions of each channel resulting in limiting the repeatability of measurements. In the document U.S. Pat. No. 5,001,416 there is disclosed a solution which has solved the required repeatability of the orbit position by means of time division multiplexing. The drawback of said solution lies in the narrow frequency bandwidth of the measuring device allowing only a slow correction of the orbit. In addition, due to the nature of the time division multiplexing said device disclosed in U.S. Pat. No. 5,001,416 is susceptible to unwanted mapping of the frequency band. All the recurrent effects of the synchrotron accelerator in the frequency range above the period of the time division multiplex may coincide distorting therewith the information about the real orbit.

It is the primarily object of the present invention to provide a method for the precise measurement of dependency on amplitude and phase of a plurality of high frequency signals, preferably with a synchrotron accelerator of elementary particles, free from the prior art drawbacks.

Further object of the invention is to provide a device for carrying out said method for the precise measurement of the dependency on amplitude and phase of plurality of high frequency signals.

The essence of the solution according to the invention lies in that with a single measuring device and without any aliasing it is achieved a resolution of 0.2 micron and repeatability of measurements of 1 micron down to the lower frequency limit of a few kHz. Simultaneously, it is possible to observe the effects in the frequency range of several MHz with the resolution being for a degree lower.

A method for the precise measurement of dependency on amplitude and phase of a plurality of high frequency signals comprises a cyclic connection by means of a radio frequency (RF) switch of each from a plurality of input signals produced by accelerating electrodes symmetrically arranged e.g. in an evacuated tube of the synchrotron accelerator of elementary particles with each from a plurality of RF processing units. Here, the cyclic connection is sequentially independent until each RF input is associated with each of the plurality of RF processing units within equally long time slots. Each analogue input signal is equally represented over the time in each RF processing unit. Input analogue signals are processed in the RF switch in a manner that said input analogue signals are in pairs simultaneously present in an arbitrary combination of different pairs of signals at the output from the RF switch.

According to the invention, sequences of the state of the RF switch are cyclic whereas the speed of the rotation of switching is such that components of asymmetry of amplification in output digital signals are eliminated by filtering using a low-pass filter. Sequences of the state of the RF switch according to the invention could be acyclic in a wide frequency range lowering aliasing therewith.

Signals are further directed from each RF unit to a plurality of analogue-to-digital (A/D) converters. Each of the plurality of the RF processing units comprises tunable amplification and attenuation, respectively, resulting, due to the setting of all RF processing units to equal amplification, in the adjustment of an amplitude level of the strongest signal to the measuring scope of each A/D converter.

The output signal from each A/D converter is directed to an amplification corrector which corrects the value of the digitalized input signal according to instructions of a system for identification of differences between amplifications of each RF unit by means of an inherent A/D converter. The signal coming out of each corrector is transmitted to a digital switch by means of which signal recombination is carried out. Said digital switch is synchronized with the RF switch in a manner that the first input signal is always processed in the first digital receiver, that the second input signal is always processed in the second digital receiver, and that the N-th input signal is always processed in the N-th digital receiver. Each signal from a plurality of digital receivers is further filtered in a plurality of low-pass filters, the band width thereof having been chosen so that it is essentially lower than the switching frequency of switches. Therewith, a vector signal averaging is achieved from the analogue part ensuring the mapping of the amplitude and phase ratio between the input signals to the output signals in a manner:

$$O_1/I_1 = O_2/I_2 = \ldots = O_N/I_N = G,$$

wherein $$G = (G_1 + G_2 + \ldots + G_N)/N$$

and wherein:
$I_1 \ldots I_N$ is the input signal,
$O_1 \ldots O_N$ is the output signal,
N is the number of individually measured signals,
$G, G_1 \ldots G_N$ is the transfer function of the RF process unit and the A/D converter.

Digital signals at the output of the amplification correctors are corrected by means of correction signals from an amplification equalizer. The correction signals are gained from the amplification equalizer in a manner that digitised signals are lead directly after the amplification corrector through a digital receiver to a low-pass filter, and afterwards they are treated by means of a circuit which compares these signals among themselves and, in order to mutually adjust signals exiting A/D converter and entering the amplification corrector, creates correction signals which are lead back to the amplification corrector.

One of the characteristics of the present invention is also shown by the fact that each individual digital signal is amplified by the amount of an average amplification of all RF processing units.

DETAILED DESCRIPTION OF THE INVENTION

Figure 1:
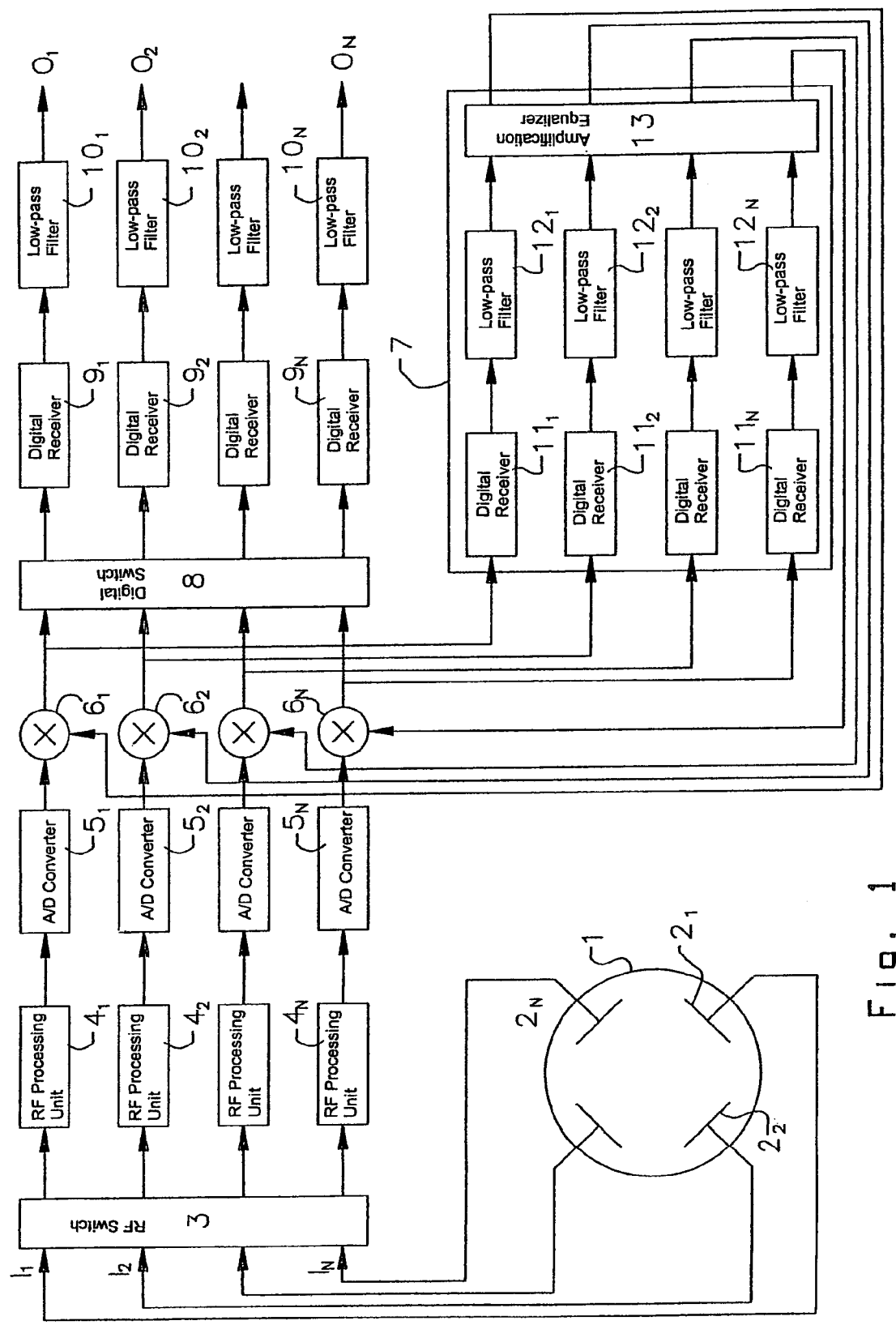
FIG. 1 is a block diagram of a measuring device in accordance with the invention.
Figure 2:
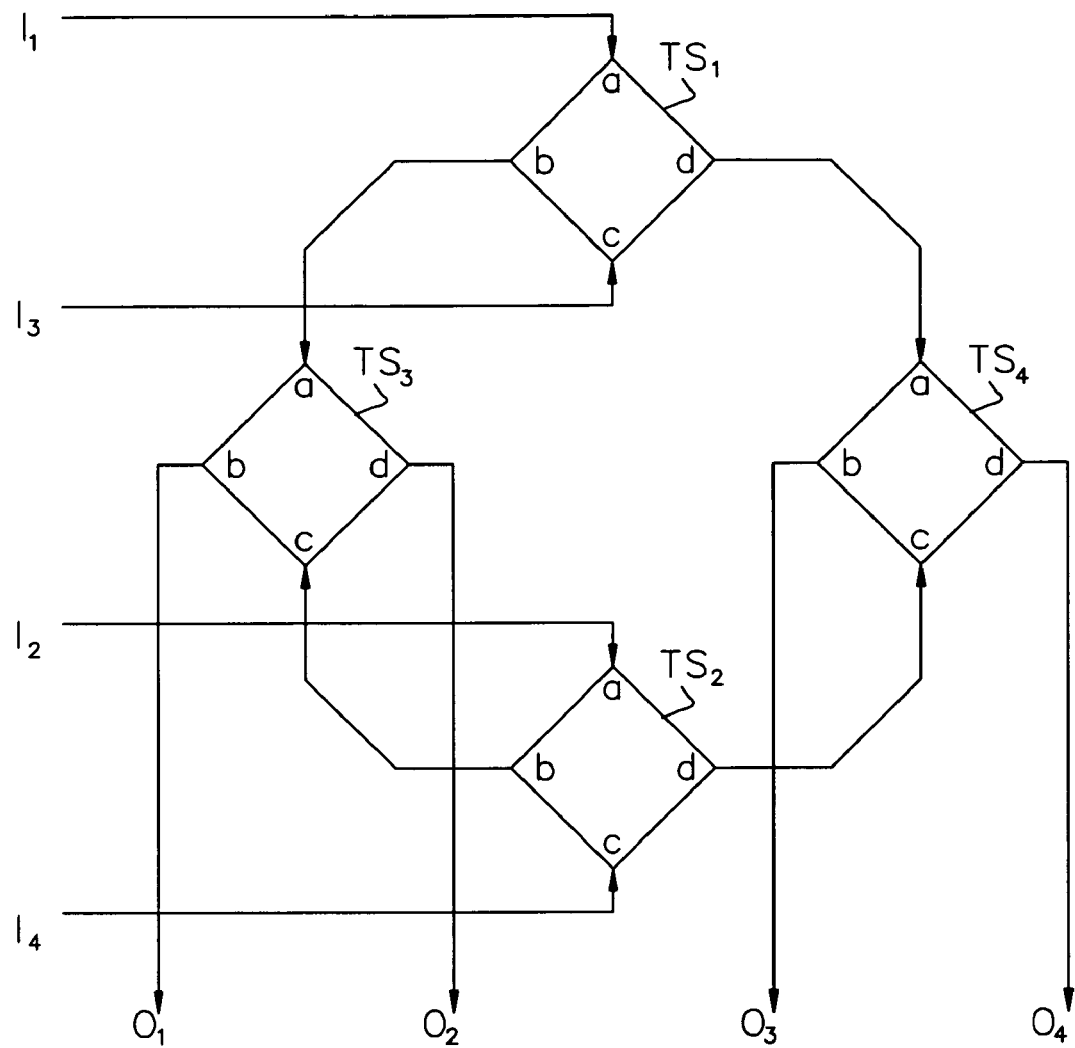
FIG. 2 is a block diagram of an RF switch in accordance with the invention.

Device for carrying out the method according to the invention will become more fully understood from the detailed description given hereinafter and the accompanying drawings, wherein FIG. 1 shows a block scheme of a measuring device, FIG. 2 shows a block scheme of an RF switch. A plurality of accelerating electrodes $2_1, 2_2, \ldots 2_N$ is symmetrically placed in an evacuated tube 1 of a synchrotron accelerator, said electrodes being arranged in a manner to measure in a transversal plane of the evacuated tube 1 and, respectively, orbit of accelerated particles, potential difference of the electric field due to the electric charge of the accelerated elementary particles. Electric signals $I_1, I_2, \ldots I_N$ which are lead to a radio frequency (RF) switch 3 are induced in the accelerating electrodes $2_1, 2_2, \ldots 2_N$ said switch being described in details below. A plurality of RF processing units $4_1, 4_2, \ldots 4_N$ with tunable amplification and attenuation, respectively, is connected to the RF switch 3, an analogue digital (A/D) converter $5_1, 5_2, \ldots 5_N$ follows each of said processing units. Tuning to an equal amplification of all the RF processing units the measuring device according to the invention adjusts the value of the amplitude of the highest signal $I_1, I_2, \ldots I_N$ to the measuring range of each A/D converter. Digital signals exiting each A/D converter are then directed to an amplification corrector $6_1, 6_2, \ldots 6_N$ where the value of each digitized input signal is corrected according to the instructions of a system 7 for identification and equalizing of differences between amplifications of each RF unit with the respective A/D converter.

Signals $I_1, I_2, \ldots I_N$ are transmitted from each amplification corrector $6_1, 6_2, \ldots 6_N$ to a digital switch 8 in which a recombination of said signals is carried out, and afterwards said signals are transmitted to a plurality of digital receivers $9_1, 9_2, \ldots 9_N$ being associated with said switch 8. The digital switch 8 is synchronized with the RF switch in a manner that regardless of the state of the RF switch 3 the input signal $I_1$ is always processed in the digital receiver $9_1$, that the input signal $I_2$ is always processed in the digital receiver $9_2$, and that the input signal IN is always processed in the digital receiver $9_N$.

FIG. 2 shows a scheme of the RF switch 3 whereby it is assumed that four input signals are processed. Here, the RF switch 3 consists of a plurality of equal switches $TS_1, TS_2, TS_3, TS_4$ where input signals $I_1, I_3$ are directed to inputs a, c of the first switch $TS_1$ and where input signals $I_2, I_4$ are directed to inputs a, c of the second switch $TS_2$. Switches $TS_3, TS_4$ are held free, meaning that they are not connected to input signals. Each output b, d of switches $TS_1, TS_2$ is associated with inputs a, c of switches $TS_3, TS_4$. Each output b, d of switches $TS_3, TS_4$ is associated with the respective RF processing unit.

Each switch $TS_1, TS_2, TS_3, TS_4$ may take up only two different states. That means that in the first state a crossover of signals over the paths a-b; c-d is enabled while other paths are closed, and that in the second state a crossover of signals over the path a-d; b-c is enabled while other paths are closed. Paths b-d; a-c are always closed.

As already mentioned above, the switches $TS_1, TS_2, TS_3, TS_4$ may take arbitrary combination of the two states whereby it is significant that they built four groups out of sixteen possible, which have, in an identical distribution of states over the time, the attribute of equally existing input signals $I_1, I_2, I_3, I_4$ and output signals $O_1, O_2, O_3, O_4$. The meaning of the symmetrical structure of each switch is that with both states of the switch the path retains identical electrical characteristics. The structure of the switches is also geometrically symmetric, resulting in identical electrical characteristics with frequencies above 100 MHz. All the above mentioned also holds for mutual connection of switches $TS_1, TS_2, TS_3, TS_4$.

The system 7 for the identification and equalization of differences between amplifications of each RF processing unit $4_1, 4_2, \ldots 4_N$ with the respective A/D converter $5_1, 5_2, \ldots 5_N$ consists of a plurality of parallel digital receivers $11_1, 11_2, \ldots 11_N$ each input thereof is connected to the location of each transition from the digital receiver $9_1, 9_2, \ldots 9_N$ to a lowpass filter $10_1, 10_2, \ldots 10_N$. Said digital receivers $11_1, 11_2, \ldots 11_N$ are connected in a plurality of low-pass filters $12_1, 12_2, \ldots 12_N$ and the outputs of said low-pass filters are connected in parallel to an amplification equalizer 13. Outputs of said amplification equalizer 13 are connected back to each amplification corrector $6_1, 6_2, \ldots 6_N$.

I claim:

1. A method for precise measurement of the dependency on amplitude and phase of a plurality of high frequency signals obtained from accelerating electrodes, comprising the following steps:

directing alternately by means of a radio frequency (RF) switch each of a plurality of analogue input signals to each of a plurality of RF processing units;

amplifying said analogue input signals in said RF processing units in order to adjust said analogue signals to the measuring range of a plurality of analogue digital (A/D) converters;

directing said amplified analogue input signals to said plurality of analogue digital converters and converting said amplified analogue signals to digital signals;

directing said digital signals to a plurality of amplification correctors;

correcting said digital signals by means of correcting signals from an amplification equalizer;

collecting digital signals exiting said correctors in a digital switch and directing an ordered recombined number of digital signals to a plurality of digital receivers; and filtering said recombined number of digital signals in a plurality of low-pass filters.

2. A method according to claim 1, wherein each analogue input signal is evenly represented over the time in each RF processing unit, and input analogue signals are processed in said RF switch in a manner that said input analogue signals may be simultaneously present in an arbitrary combination of different pairs of signals on the output of the RF switch.

3. A method according to claim 1, wherein correcting signals from the amplification equalizer are obtained in a manner that said digitalized signals are led directly after said amplification corrector through the digital receiver to the low-pass filter where they are treated by means of a circuit which mutually compares said signals, and in order to mutually adjust signals which leave the A/D converter and enter the amplification corrector creates correcting signals being directed back to the amplification corrector.

4. A method according to claim 1, wherein a sequence of states of said RF switch is cyclic whereas the speed of rotation of switching is such that components of amplification asymmetry in said output digital signals are eliminated by means of filtering with the low-pass filter.

5. A method according to claim 1, wherein a sequence of states of the RF switch is acyclic in a wide frequency range whereby aliasing is lowered.

6. A method according to claim 1, wherein each digital signal is amplified by an average amplification of all RF processing units.

7. A device for precise measuring of dependency on amplitude and phase of a plurality of high frequency signals, comprising:
- a radio frequency (RF) switch to an input thereof it is directed to a plurality of input signals originating in accelerating electrodes symmetrically arranged in an evacuated pipe;
- a plurality of RF processing units connected in parallel to said RF switch;
- a plurality of analogue digital (A/D) converters each connected in series to a corresponding one of said plurality of RF processing units;
- a plurality of amplification correctors each connected in series to a corresponding one of said plurality of A/D converters;
- a digital switch, to an input side thereof is connected in parallel said plurality of amplification correctors and to an output side thereof is connected a plurality of digital receivers;
- a plurality of low-pass filters each connected in series to a corresponding one of said plurality of digital receivers, a respective number of outputs signals for further evaluation resulting from said plurality of low-pass filters; and
- a system for identification and equalization of differences between the amplification of each one of said plurality of RF processing units with a respective one of said plurality of A/D converters, wherein a plurality of inputs of the system is connected with the location of each transition from the amplification corrector to the digital switch and wherein a plurality of outputs of the system is connected to said plurality of amplification correctors.

8. A device according to claim 7, wherein said RF switch comprises a plurality of identical switches wherein first input signals are transmitted to inputs of a first switch and wherein second input signals are transmitted to inputs of a second switch while other switches are held free; wherein each output of said first and second switches is connected to an input of said other switches; and wherein each output of said other switches is connected to a respective one of said plurality of RF processing units.

9. A device according to claim 7, wherein each RF switch may take up two different states wherein in a first state a crossover of signals over first paths are enabled while other paths are closed; wherein in a second state a crossover of signals over second paths are enabled while other paths are closed; and wherein third paths are always closed.

10. A device according to claim 7, wherein the system for identification and equalization of differences between amplifications of individual RF processing units with the respective A/D converter comprises a plurality of parallel equalizer digital receivers wherein each input thereof is connected to the location of each transition from said digital receiver to said corresponding low-pass filter and being connected in series to a plurality of equalizer low-pass filters, the outputs of said equalizer low-pass filters are connected in parallel to an amplification equalizer and the outputs thereof are connected to each corresponding amplification corrector.

* * * * *